US009543736B1

(12) United States Patent
Barwicz et al.

(10) Patent No.: US 9,543,736 B1
(45) Date of Patent: Jan. 10, 2017

(54) OPTIMIZED SOLDER PADS FOR SOLDER INDUCED ALIGNMENT OF OPTO-ELECTRONIC CHIPS

(71) Applicant: INTERNATIONAL BUSINESS MACHINES CORPORATION, Armonk, NY (US)

(72) Inventors: Tymon Barwicz, Yorktown Heights, NY (US); Yves Martin, Ossining, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/947,621

(22) Filed: Nov. 20, 2015

(51) Int. Cl.
*H01S 5/022* (2006.01)
*H01S 5/30* (2006.01)
*H01S 5/024* (2006.01)
*G02B 6/13* (2006.01)
*G02B 6/12* (2006.01)

(52) U.S. Cl.
CPC ............ *H01S 5/02272* (2013.01); *G02B 6/13* (2013.01); *H01S 5/02284* (2013.01); *H01S 5/02469* (2013.01); *H01S 5/3013* (2013.01); *G02B 2006/12147* (2013.01)

(58) Field of Classification Search
None
See application file for complete search history.

(56) References Cited

U.S. PATENT DOCUMENTS

| 3,770,874 | A | * | 11/1973 | Krieger | ............... | H01L 24/81 |
| | | | | | | 174/257 |
| 5,015,206 | A | * | 5/1991 | Dennis | ............... | H01R 12/57 |
| | | | | | | 29/874 |
| 5,706,578 | A | * | 1/1998 | Hubner | ............ | H01L 25/0657 |
| | | | | | | 174/259 |
| 5,764,833 | A | * | 6/1998 | Kakii | ................. | G02B 6/262 |
| | | | | | | 385/43 |

(Continued)

OTHER PUBLICATIONS

Hermann Oppermann, "Fraunhofer IZM," Dept. System Integration & Interconnection Technologies Group: Interconnect Metallurgy & Processes, Jul. 7, 2011, pp. 1-11.

(Continued)

*Primary Examiner* — Scott B Geyer
(74) *Attorney, Agent, or Firm* — Cantor Colburn LLP; Vazken Alexanian

(57) ABSTRACT

A technique relates to assembling a multi-chip system. A first chip stack element having two major surfaces and a first solder pad, a first vertical stop, a first lateral stop and a first waveguiding element is provided. A second chip stack element having two major surfaces and including a second solder pad, a flow resistor connected to the second solder pad, a second vertical stop, a second lateral stop, a reservoir pad connected to the flow resistor, and a second waveguiding element is provided. A solder material is plated to form a plated solder pad. A technique includes pre-aligning the first chip stack element and the second chip stack element, raising the temperature to a temperature above the melting temperature of the solder material, and flowing solder through the flow resistor. Aspects include aligning the first and second waveguiding elements and cooling the connected assembly to re-solidify the solder material.

19 Claims, 13 Drawing Sheets

(56) References Cited

U.S. PATENT DOCUMENTS

| | | | | |
|---|---|---|---|---|
| 6,053,395 | A * | 4/2000 | Sasaki | G02B 6/4214 |
| | | | | 228/180.22 |
| 6,259,608 | B1 * | 7/2001 | Berardinelli | H01L 23/49838 |
| | | | | 174/250 |
| 6,392,163 | B1 * | 5/2002 | Rinne | C08F 8/44 |
| | | | | 174/261 |
| 6,839,497 | B2 * | 1/2005 | Park | G02B 6/12004 |
| | | | | 385/129 |
| 6,866,426 | B1 * | 3/2005 | Steinberg | G02B 6/30 |
| | | | | 385/65 |
| 2002/0020551 | A1 * | 2/2002 | Rinne | C08F 8/44 |
| | | | | 174/261 |
| 2005/0047721 | A1 * | 3/2005 | Chen | G02B 6/358 |
| | | | | 385/40 |
| 2006/0249744 | A1 * | 11/2006 | Kim | H01L 23/15 |
| | | | | 257/99 |

OTHER PUBLICATIONS

Jae-Woong Nah, et al. "Flip chip Assembly with Sub-micron 3D Re-alignment via Solder Surface Tension," Electronic Components & Technology Conference, 2015 IEEE, pp. 35-40.

K.P. Jackson, et al., "A High-Density, Four-Channel, OEIC Transceiver Module Utilizing Planar-Processed Optical Naveguides and Flip-Chip, Solder-Bump Technology," Journal of Lightwave Technology, vol. 12, No. 7, Jul. 1994, pp. 1185-1191.

List of IBM Patents or Patent Applications Treated as Related; (Appendix P), Filed Mar. 23, 2016; 2 pages.

M. Hutter, et al., "Precise Flip Chip Assembly Using Electroplated AuSn20 and SnAg3.5 Solder," Electronic Components and Technology Conference, 2006 IEEE, pp. 1087-1094.

* cited by examiner

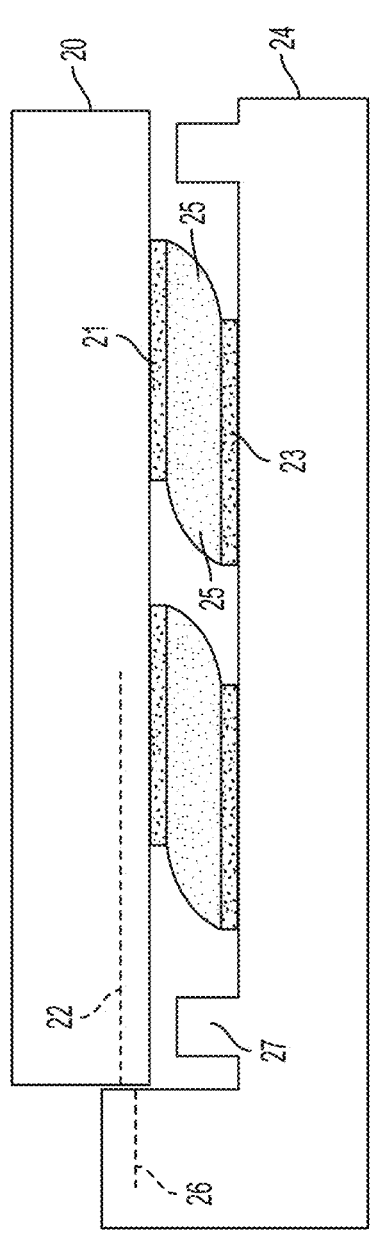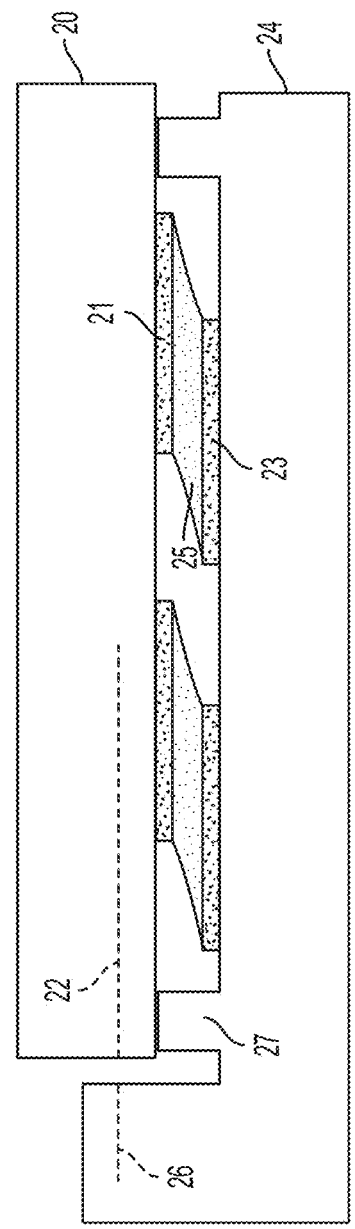
FIG. 3A (PRIOR ART)
FIG. 3B (PRIOR ART)

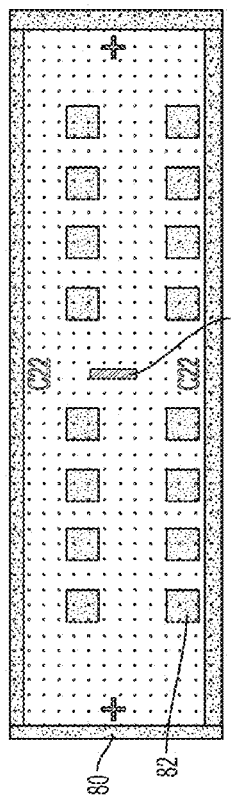
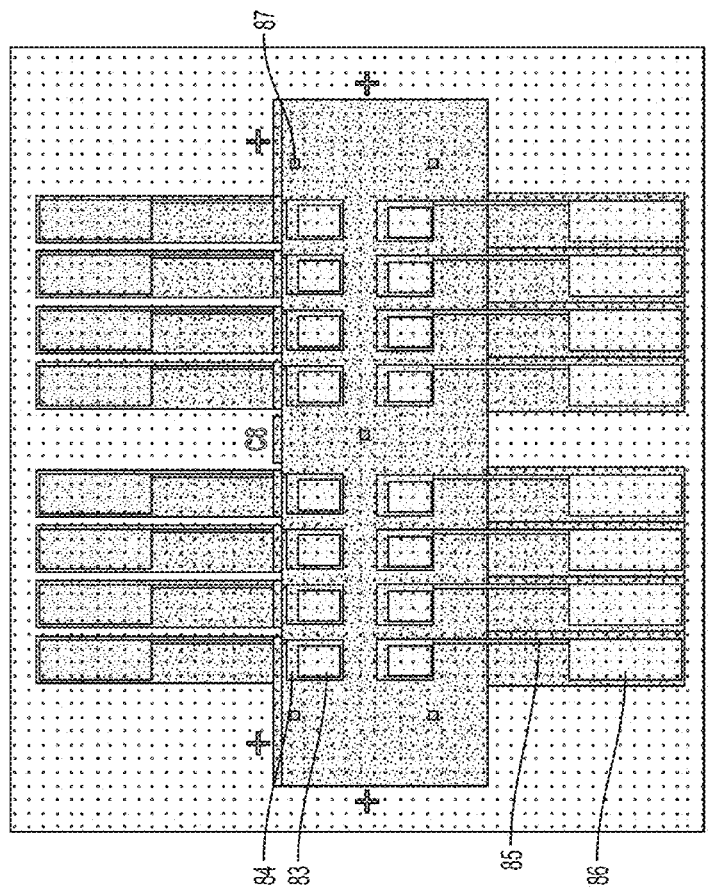
FIG. 8A
FIG. 8B

OPTIMIZED SOLDER PADS FOR SOLDER INDUCED ALIGNMENT OF OPTO-ELECTRONIC CHIPS

BACKGROUND

The present invention generally relates to semiconductor chip assembly, and more specifically, to optimized solder pads for solder induced alignment of optoelectronic chips.

Solder pads can be used in the micro-electronics industry to make electrical and mechanical contacts or connections between integrated circuits (ICs) or between printed circuit boards (PCBs). Solder pads can also be used to make electrical and mechanical contacts or connections between optoelectronic and integrated photonic circuits and components.

To achieve such electrical and mechanical contacts and connections, the surfaces of two or more circuits to be connected can be coated with metal pads formed of one or more thin metal films such as titanium, nickel, copper, platinum, and/or gold, also and called Under-Bump Metallization pads (UBM pads). When these pads are coated with solder material they are referred to as plated solder pads.

Solder materials, such as tin, silver, gold, bismuth, indium or lead, can then be deposited on some of the metal pads on the substrate, using, for instance, electroplating to form a plated substrate. The surfaces of two circuits to be connected can thereafter be brought into close proximity or contact and then temperature can be temporarily elevated beyond the melting temperature of the solder material. When the solder materials are heated beyond the melting temperature, the melted solder can ball-up to minimize surface tension, contact a UBM that is in close vertical proximity, wick this proximate or other adjacent UBM pads and establish electrical contacts between the two circuits in close contact. Upon cooling, the solder can solidify to mechanically and electrically connect the two circuits.

The amount of solder deposited on UBM pads can impact the behavior and integrity of contacts between two circuits. Many applications using UBM pads and solder involve a very large number of potential solder connections and have a relatively small area on the chip between the solder connections. Adjusting the amount and uniformity of the solder on a large array of UBM pads can be a challenging task. If too little solder is used at a particular location, for example, an electrical connection can be incomplete or fragile to mechanical stress and fatigue, potentially resulting in system failure due to an electrical open. On the other hand, if too much solder is used at a particular location, additional solder could result in bulges in the solder bumps and spurious contacts between adjacent solder bumps, potentially resulting in a failure due to a short. Industry trends favoring ever smaller microelectronic components call for further reductions in space between solder contacts, while uniformity of solder plating can be on the order of 10% when wafers of 200 or 300 mm in diameter are plated. This can increase the potential of defects or degradation of the contacts and system failure.

Soldering applications can also be used during assembly of optoelectronic assemblies. Some applications call for alignment of chips in such assemblies on the order of micron or sub-micron precision. For example, semiconductor lasers generate infra-red radiation in a tightly confined channel, or waveguide, wherein the size of the beam emanating from the laser can be on a scale of one half a micron to 5 microns. In such applications, horizontal and vertical forces generated during solder melting of chip assembly can be used to assist with chip alignment. However, such applications can be highly sensitive to over-plating and under-plating of solder.

SUMMARY

In one embodiment, a method of assembling a multi-chip system is provided. The method includes providing a first chip stack element having two major surfaces, the first chip stack element comprising a first solder pad on a plane of one of the major surfaces, a first vertical stop, a first lateral stop, and a first waveguiding element. The method also includes providing a second chip stack element having two major surfaces, the second chip stack element comprising a second solder pad, a flow resistor connected to the second solder pad, a second vertical stop, a second lateral stop, and a reservoir pad connected to the flow resistor, and a second waveguiding element. The method also includes optionally plating the reservoir pad with a reservoir solder material and plating a solder material on the second solder pad to form a plated solder pad, wherein the height of the plated solder material on the second solder pad is at a height that is higher than the height of plated reservoir solder material. The method also includes pre-aligning the first chip stack element and the second chip stack element to bring the first solder pad in proximity to the plated solder pad. The method also includes raising the temperature to a temperature above the melting temperature of the solder material. The method also includes flowing solder through the flow resistor. The method also includes aligning the first and second waveguiding elements. The method also includes cooling the connected assembly to re-solidify the solder material.

In another embodiment, a multi-chip system is provided. The multi-chip system includes a first chip stack element having two major surfaces, the first chip stack element comprising a first solder pad on a plane of one of the major surfaces, a first vertical stop, a first lateral stop, and a first waveguiding element. The multi-chip system also includes a second chip stack element having two major surfaces, the second chip stack element including a second solder pad, a flow resistor connected to the solder pad, a reservoir pad connected to the flow resistor, a second waveguiding element, a second vertical stop, and a second lateral stop. The system also includes a solder material connecting the first solder pad to the second solder pad. In the multi-chip system, the first the first lateral stop is in proximity to the second lateral stop. In the multi-chip system, the first vertical is in proximity to the second vertical stop. In the multi-chip system, the first waveguiding element is in proximity to the second waveguiding element and the solder pad and plated solder pad are offset in the horizontal direction.

In yet another embodiment, a chip stack element is provided. The chip stack element includes a first major surface, a second major surface, a waveguiding element, and a solder pad. The chip stack element also includes solder plated on the solder pad to form a plated solder pad. The chip stack element also includes a flow resistor connected to the plated solder pad. The chip stack element also includes a reservoir pad connected to the flow resistor.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 2A-2C are cross-sectional side views of a conventional optoelectronic assembly that illustrate solder-induced chip alignment, wherein;

FIG. 2A illustrates an optoelectronic chip being placed over an optoelectronic substrate after coarse pre-alignment and before solder has been melted;

FIG. 2B illustrates the motion of the optoelectronic chip while the solder is melted;

FIG. 2C illustrates a cross-sectional view of an optoelectronic chip over a an optoelectronic substrate after solder has been melted and solidified;

FIG. 3A is a cross-sectional side view of an optoelectronic assembly that illustrates misalignment of the assembly due to solder over-plating;

FIG. 3B is a cross-sectional side view of an optoelectronic assembly that illustrates misalignment of the assembly due to solder under-plating;

FIG. 6A is micrograph showing a top view of a silicon chip receiving structure from an optoelectronic assembly. FIG. 6B shows a bottom view of the top chip stack element of a conventional optoelectronic assembly.

FIG. 7B illustrates an embodiment including a top solder pad, flow resistor and reservoir pad in relation to a bottom plated solder pad; FIG. 7C illustrates an embodiment including a bottom plated solder pad, flow resistor, and reservoir pad in relation to a top solder pad FIGS. 7A-7C illustrate relative arrangements of solder pads, reservoir pads, and plated solder pads in various embodiments of the disclosure:

FIG. 7A depicts a top view of a spatial arrangement of a solder pad, flow resistor, and reservoir pad.

FIG. 7B depicts a top view of a spatial arrangement of a solder pad, flow resistor, reservoir pad, and plated solder pad in an embodiment.

FIG. 7C depicts a top view of a spatial arrangement of a solder pad, flow resistor, reservoir pad, and plated solder pad in another embodiment.

FIGS. 8A-8B depict a top chip stack element, FIG. 8A, and a bottom chip stack element, FIG. 8B, in an embodiment of the disclosure.

FIG. 10A is a view during coarse pre-alignment; FIG. 10B is a view after pick and place; FIG. 10C is a view after anneal.

FIG. 11A is a view during coarse pre-alignment; FIG. 11B is a view after pick and place; FIG. 11C is a view after anneal.

FIG. 12A is a view during coarse pre-alignment; FIG. 12B is a view after pick and place; FIG. 12C is a view after anneal.

FIG. 13A is a view during coarse pre-alignment; FIG. 13B is a view after pick and place; FIG. 13C is a view after anneal.

DETAILED DESCRIPTION

Figure 1A:
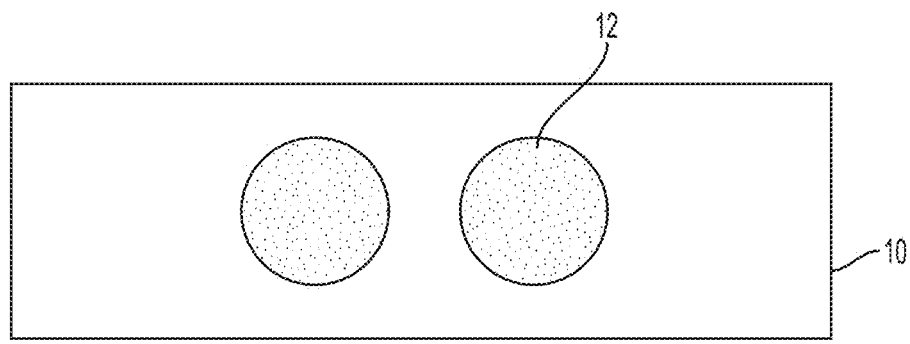
FIG. 1A is a top view of a conventional plated substrate.

As stated above, the present invention relates to semiconductor chip assembly, and more specifically, to optimized solder pads for solder induced alignment of optoelectronic assemblies. It is noted that like reference numerals refer to like elements across different embodiments.

Making electrical and mechanical contacts or connections between chips or between chips and substrates through the use of soldering applications can result in shorting or incomplete or fragile connections, particularly as devices are scaled down and demands are made for larger numbers of connections in a smaller area. Additionally, solder induced alignment of optoelectronic assemblies can be sensitive to over plating or under plating of solder when attempting to obtain the desired horizontal and vertical alignment during assembly.

For example, in a conventional flip-chip bonding process a pick and place tool may be used to place a chip face down on a substrate, where the chip contains solder balls on about 200 micron pitch, for example, controlled collapse chip connections (C4s), and the chip contains matching solder pads. The combination can be passed through an oven, such as a reflow furnace, to join the chip to the substrate by melting the solder. The surface tension of the solder in the molten state can serve to self-align the chip to the substrate when the solder balls are placed on the appropriate solder pads.

Figure 1B:
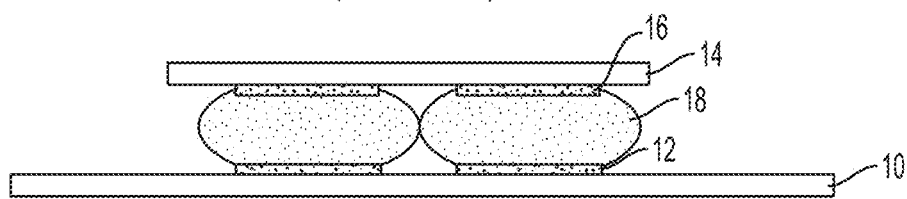
FIG. 1B is a side view of a portion of a conventional substrate chip depicting an over-plated assembly.
Figure 1C:
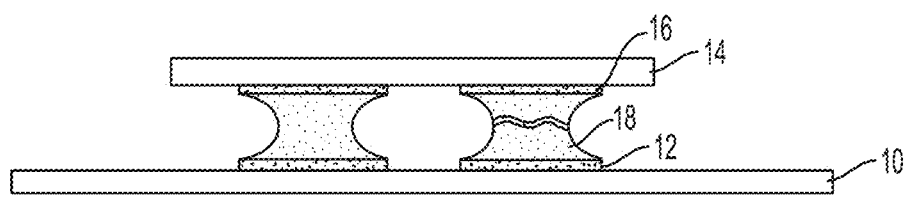
FIG. 1C is a side view of a portion of a conventional substrate chip depicting an under-plated assembly.

FIGS. 1A-1C illustrate a portion of a conventional plated substrate chip. FIG. 1A illustrates a top view of a conventional plated substrate. As shown in FIG. 1A, a bottom solder pad 12 is plated or deposited onto a substrate 10. FIG. 1B depicts a side view of a portion of a conventional substrate chip containing substrate 10 with bottom solder pad 12, a chip 14 having a top solder pad 16 plated thereon, and solder 18 between the top solder pad 16 and bottom solder pad 12 to form a mechanical and electrical connection. During assembly, or in packaging applications, solder material 18 can be deposited on either a substrate 10 or a chip 14. When the substrate 10 and chip 14 are brought into proximity, solder can be melted and re-solidified, for example by raising the temperature of the assembly above the temperature of the solder in an oven and then cooling the assembly. During the melting process, solder on the bottom solder pad 12, or alternatively the top solder pad 18, wets the UBMs of both substrate and chip and can form bonds with both of the bottom solder pad 12 and the top solder pad 16.

Soldering applications can be sensitive to the amount of solder plated at each connection site, such that too much or too little solder at any one site can result in failure of the entire assembly. FIG. 1B depicts an over-plated assembly, where solder 18 between adjacent solder pads bulges horizontally to the point of forming an electrical contact between adjacent connection sites. This can result in an electrical short in the finished circuit during operation and can render the circuit inoperative. FIG. 1C is a side view of a portion of a conventional substrate circuit depicting an under-plated assembly. After melting and re-solidifying, missing metal can render the solder connections fragile to mechanical stress and fatigue and potentially susceptible to fractures and electrical opens, which can also render the circuit inoperative. As scaling of such circuits continues, interconnect sensitivity to over-plating and under-plating of solder will be increasingly problematic.

Figure 2A:
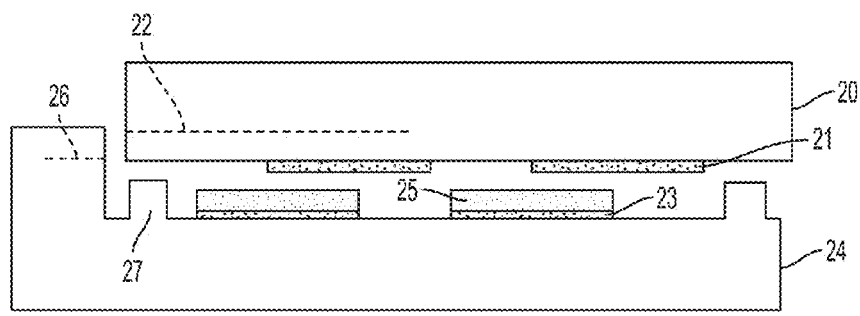
Figure 2B:
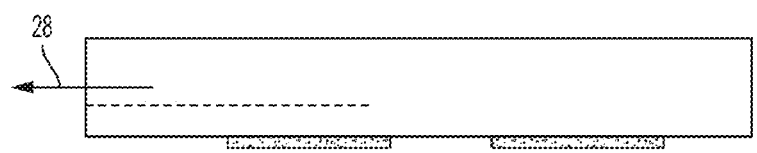
Figure 2C:
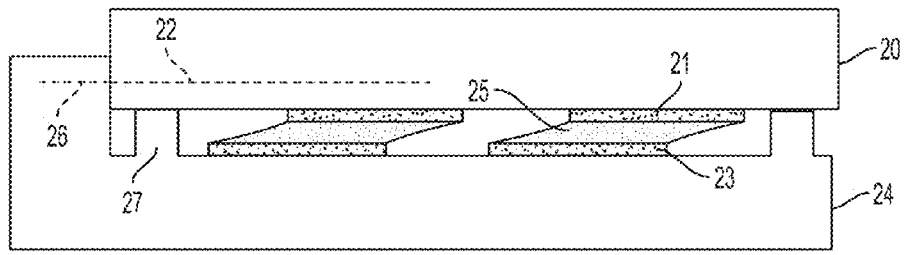

FIGS. 2A-C depicts a conventional optoelectronic system that uses solder induced chip alignment. FIG. 2A shows a cross sectional view of an optoelectronic assembly prior to solder melting. A top optoelectronic chip 20 contains a top waveguide 22 and top optoelectronic solder pads 21. A bottom optoelectronic substrate 24 contains a mechanical stop or standoff 27, a bottom waveguide 26, bottom optoelectronic solder pads 23, and plated solder balls 25 connected to the bottom solder pads 23. The waveguide, in some embodiments, can be a channel in which to pass a light wave or radiation, such as a semiconductor laser that generates infra-red radiation. Such waveguides can be relatively small depending on the application. For instance, the size of the cross-sectional energy distribution of the photonic mode emanating from a semiconductor laser can be on the order of 0.5 to 5 microns. As is shown in FIG. 2A, prior to solder melting, the top optoelectronic chip 20 is adjacent to the bottom optoelectronic substrate 64, such that the optoelectronic solder pads of the top and bottom overlap, but are not directly positioned above one another in the vertical plane.

FIG. 2B depicts the desired movement 28 of the top optoelectronic chip 60 during solder melting. The top optoelectronic chip can potentially move to the left, as depicted, in the horizontal direction. The horizontal movement can be enabled through the solder melt, which can assert a horizontal and/or a vertical force due to the surface tension of the melted solder. Standoffs 27 can be used to prevent or lessen vertical movement. The vertical force exerted by the solder surface tension on the standoffs 27 can create friction that can hinder the horizontal movement. FIG. 2C illustrates a cross-sectional view of an optoelectronic chip over an optoelectronic substrate after solder has been melted and re-solidified. As is shown, the solder 25 forms an electrical and mechanical connection between the top optoelectronic chip 20 and the bottom optoelectronic substrate 64. When the top optoelectronic chip 20 and bottom optoelectronic substrate 24 are correctly assembled, top waveguide 22 and bottom waveguide 26 are aligned such that light or radiation emitted by the assembly will be coupled into the waveguide of the assembly.

FIG. 3A illustrates misalignment of the waveguide in an optoelectronic assembly that can occur when solder is over-plated. As is shown, the chip 20 moved in the horizontal direction but remains too high in the cavity due to excess solder 25. Movement due to vertical force can be inhibited by contact with the standoffs 27.

FIG. 3B illustrates misalignment of the waveguide in an optoelectronic assembly that can occur when solder is under-plated. As is shown, the chip 20 could not complete the horizontal movement required for self-alignment as the lack of solder created a large vertical force and a low horizontal force. The vertical downward force in such a case is large compared to the horizontal force and friction over standoffs 27 and then hinders the chip horizontal motion such that the waveguides 22 and 26 fail to align properly.

Figure 4:
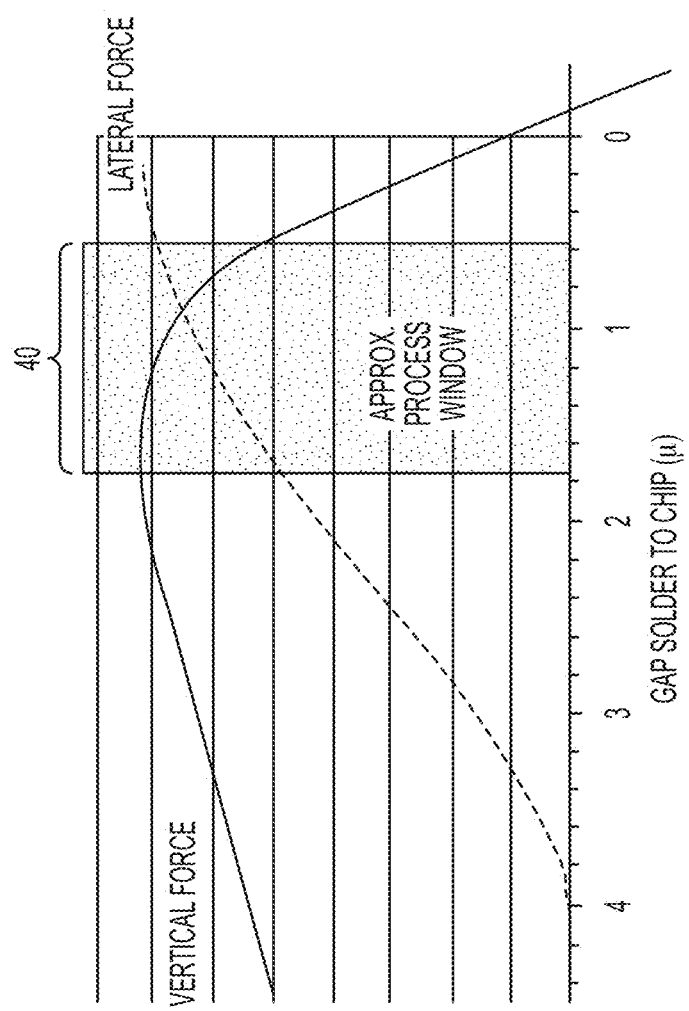
FIG. 4 illustrates calculated vertical and lateral forces in a conventional optoelectronic assembly versus the relative height of gap, measured in microns, between the solder material of one chip and the solder pad or solder material of the other chip of the assembly.

FIG. 4 illustrates calculated vertical and lateral forces in a conventional optoelectronic assembly versus the distance between solder and chip measured in microns during assembly of the conventional assembly represented by FIGS. 2A-C. As is shown, lateral force and vertical force calculated during solder melt can vary based upon the size of the gap between solder and chip. The process window 40 wherein the lateral and vertical forces allow for waveguide alignment in a conventional optoelectronic assembly is relatively narrow.

Figure 5B:
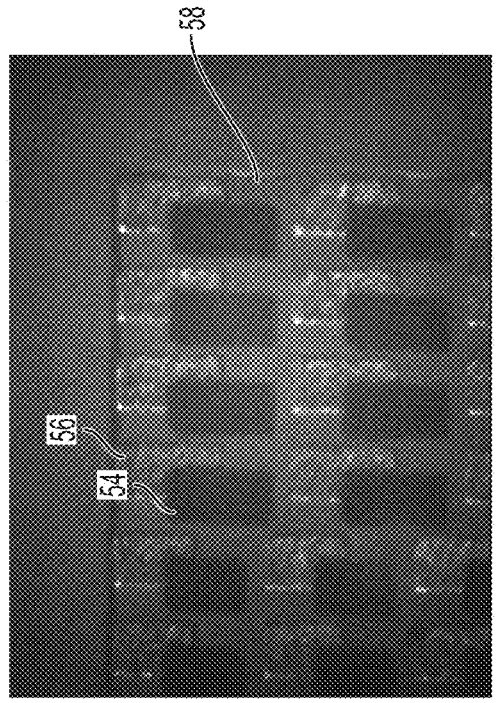
FIG. 5B depicts an infrared view of a photonic assembly prior to anneal of the top and bottom assembly elements.
Figure 5A:
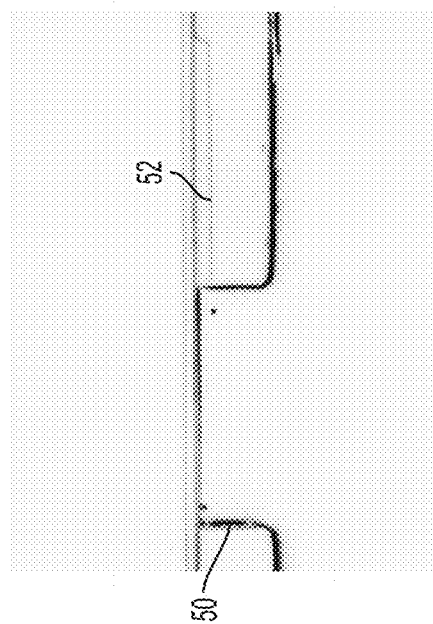
FIG. 5A shows a micrograph of a cross-sectional view of a portion of a photonic die assembled to a laser mock-up chip.

FIG. 5A shows a micrograph of a cross-sectional view of a portion of a bottom photonic die assembly to a top optoelectronic chip. As is shown, a bottom photonic die standoff 50 can act as both a vertical and lateral stop. The top optoelectronic chip can have a protruding element acting as a lateral stop 52. The surface of the top optoelectronic chip acts as the vertical stop. Alignment between the bottom and top chip can be warranted by vertical butting of the standoff 50 on the surface of the top chip and the lateral butting of standoff 50 on lateral stop 52. FIG. 5B depicts an infrared view of a photonic assembly prior to anneal of the top and bottom assembly elements. The assembly includes a top optoelectronic chip pads 54, photonic die pads 56, and optional tacking fluid 58. The pads 54 and 56 are deliberately offset at pick and place. After self-alignment. A residual angle in the solder is included and can provide residual butting force on the standoffs to maintain alignment.

Figure 6A:
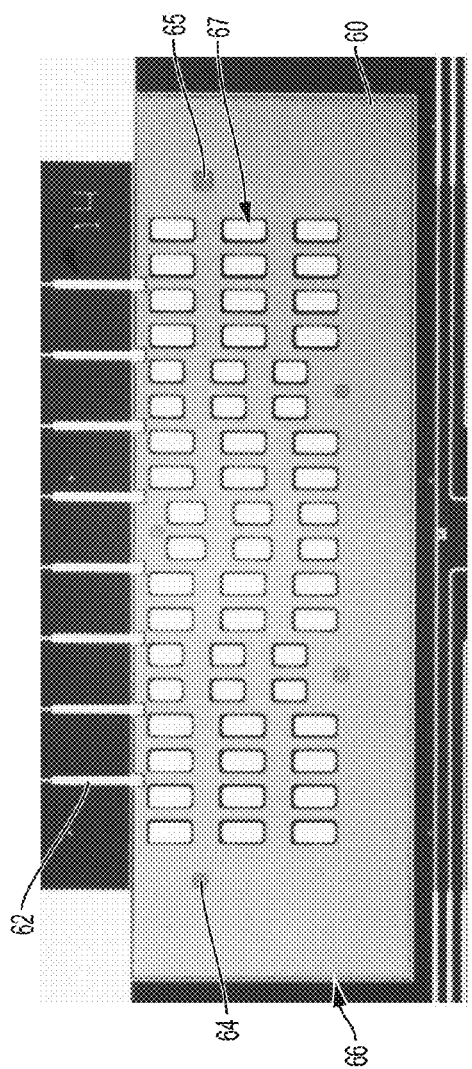
FIGS. 6A-B depict the top and bottom chip stack elements of a conventional optoelectronic assembly
Figure 6B:
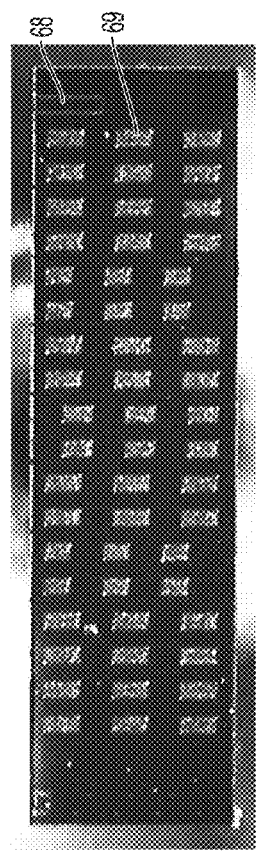

FIGS. 6A-B depict the top and bottom chip stack elements of a conventional optoelectronic assembly. FIG. 6A is micrograph showing a top view of a silicon chip receiving structure, which can be the bottom chip stack element of an optoelectronic assembly. As is shown in FIG. 6, conventional optoelectronic assemblies contain standoffs 64 or standoff-lateral stops 65 on a bottom substrate of an assembly. The silicon chip receiving structure contains an array of solder pads 67. The silicon chip receiving structure also contains several waveguide couplers 62. FIG. 6B shows a bottom view of the top chip stack element of a conventional optoelectronic assembly. As is shown in FIG. 6B, lateral stops 68 can be present and an array of solder pads 69 is present. Solder pads on at least one side of the chip stack can be plated with solder.

Such conventional optoelectronic assemblies can be sensitive to the amount of solder plated at each connection site.

Figure 7C:
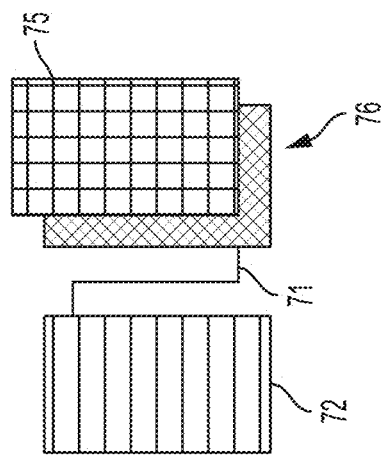
FIGS. 7A-C illustrate solder pad implementations according to the disclosure, in which 7A illustrates a solder pad, flow resistor and reservoir pad.
Figure 7B:
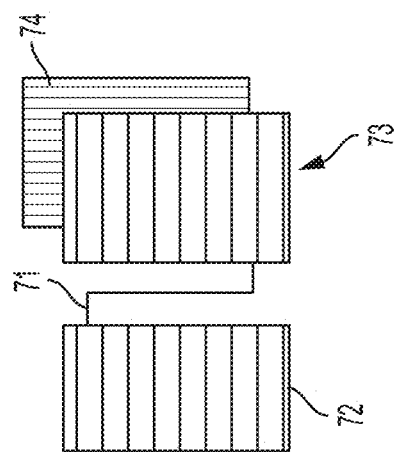
Figure 7A:
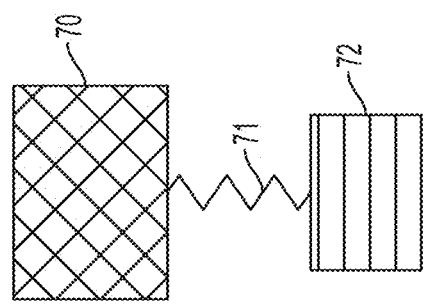

With reference to FIGS. 7A-7C, in one embodiment, an improved optoelectronic assembly containing optimized solder pads is provided. As is shown in FIG. 7A, in some embodiments, a solder pad 70 is connected to a flow resistor 71 and reservoir pad 72. FIGS. 7A-7C illustrate relative arrangements of solder pads, reservoir pads, and over-plated solder pads in various embodiments of the disclosure.

As used herein, over-plated means that the solder is plated in an amount such in excess of the amount that would be needed to align vertically a top chip stack element and a bottom chip stack element in a comparably sized conventional optoelectronic chip having top and bottom solder pads of the same dimensions. In some embodiments, during annealing of the multi-chip system, some melted solder can flow from solder pad 70 across flow resistor onto reservoir pad 72. Thus, in some embodiments, an over-plated solder pad may become a plated solder pad during annealing such that the amount remaining on the solder pad is no longer in excess of the amount that would be needed to align vertically a top chip stack element and a bottom chip stack element in a comparably sized conventional optoelectronic chip having top and bottom solder pads of the same dimensions.

At anneal of the multi-chip system, the conditions for horizontal re-alignment are highly favorable with excess solder in the over-plated pad. The horizontal force can be strong and the friction force can be small as there may be little or no contact to the standoffs. Once a sufficient amount of solder leaks away from the over-plated pad to the reservoir through the flow resistor, the self-alignment can be completed with a vertical movement resulting in proper standoff contact warranting vertical self-alignment.

FIG. 7B illustrates an embodiment including a top solder pad 73 connected to a flow resistor 71 and reservoir pad 72, wherein the top solder pad 73 is in close proximity to a bottom over-plated solder pad 74. Bottom over-plated solder pad 74 is over-plated with solder. In this embodiment, flow resistor 71 and reservoir pad 72 are on a top chip.

FIG. 7C illustrates another embodiment, in which a bottom over-plated solder pad 76 is connected to a flow resistor 71 and a reservoir pad 72. A top solder pad 75 is in close proximity to the top solder pad 75. In this embodiment, flow resistor 71 and reservoir pad are on a bottom chip. Bottom plated solder pad 76 is over-plated with solder.

In some embodiments of the disclosure, a multi-chip system is an optoelectronic assembly that includes a first chip stack element and a second chip stack element, wherein the first and/or second chip stack element include improved solder pads in accordance with the disclosure. FIGS. 8A-8B depict a top chip stack element (FIG. 8A) and a bottom chip stack element (FIG. 8B) in an embodiment of the disclosure. It will be appreciated that any number of pads and standoffs can be used.

With reference to FIG. 8A, a chip stack element can be a top chip 80 including multiple solder pads 82 and a lateral stop 81. A corresponding chip stack element, depicted in FIG. 8B, includes over-plated solder pads 83 connected to flow resistors 85 through solder pad 84. Flow resistors 85 can form a link or flow resistor to a reservoir pad 86, such that melted solder can flow from the over-plated solder pads 83 to the reservoir pads 86 during annealing. In some embodiments, reservoir pad 86 is empty, i.e., is not plated with solder, prior to annealing. The bottom chip can also include standoffs 87 to provide mechanical guidance or support during or after annealing of the top and bottom chip stack elements. The horizontal alignment can be warranted by the lateral stop 81 laterally butting on a given standoff 87 such as the center standoff of FIG. 8B.

semiconductor material, including for instance silicon, germanium, gallium, arsenide, indium phosphide, or glass.

The solder pads (also referred to herein as UBM pads), reservoir pads, and flow resistors in accordance with the disclosure are metal films that can be single- or multilayered, and each layer can contain a single metal or a blend of metals. Exemplary metals used in the pads include, but are not limited to, titanium, nickel, copper, platinum and gold. Solder pads can be deposited on a surface by a variety of methods, including for instance electroplating, electroless plating, vacuum deposition by evaporation or sputtering, or by chemical plating. In some embodiments, solder pads are deposited on a substrate by electroplating. In some embodiments, the thickness of the solder pads is 0.01 to 10 microns, such as 0.5 to 5 microns.

The solder pads of the present disclosure can be any shape. In some embodiments, the solder pads are square or rectangular. In some embodiments, the solder pads are circular or elliptical. The solder pads can vary in size based upon the design parameters and constraints of the chip assembly. For example, in some embodiments, the solder pads can have a length and/or width from 30 to 500 microns. For example, in some embodiments, a plated or over-plated solder pad can have a width of 140 microns and a length of 200 microns. In some embodiments, the reservoir pad has an area that is greater than or equal to the area of the plated or over-plated solder pad. In preferred embodiments, the reservoir pad has an area that is greater than the area of the plated or over-plated solder pad. For example, a reservoir pad can have a width of 140 microns and a length of 400 microns.

In some embodiments, the flow resistor is sized to restrict the rate of flow across the flow resistor to allow time for horizontal alignment of a top chip stack element before flow to the reservoir pad is complete. In some embodiments, the flow resistor is a channel with a width of 5 to 40 microns and a length of 50 to 1000 microns. The flow resistor can be straight, serpentine, or other shape. Exemplary dimensions of plated solder pads, solder pads, flow resistors, and reservoir pads in various embodiments of the disclosure are reflected in the table below. Top and bottom pads can be offset in the X-Y horizontal plane from one another in a plated assembly including a bottom chip stack element and a top chip stack element.

| BOTTOM CHIP STACK ELEMENT | | ID | 1 | 2 | 3 | 4 | 5 | 6 | 7 | 8 | 9 | 10 | 11 |
|---|---|---|---|---|---|---|---|---|---|---|---|---|---|
| | pad width X | | 140 | 140 | 140 | 140 | 140 | 140 | 140 | 140 | 140 | 140 | 140 |
| | pad width Y | | 200 | 200 | 200 | 200 | 200 | 200 | 200 | 200 | 200 | 200 | 200 |
| Solder pad offset | X | | 30 | 30 | 30 | 30 | 30 | 30 | 30 | 30 | 30 | 30 | 30 |
| | Y | | 30 | 30 | 30 | 30 | 30 | 30 | 30 | 30 | 30 | 30 | 30 |
| Reservoir | pad width X | | 140 | 140 | 140 | 140 | 140 | 140 | 140 | 140 | 140 | 140 | 140 |
| | pad width Y | | 400 | 400 | 400 | 400 | 400 | 400 | 400 | 400 | 400 | 400 | 400 |
| Flow resistor | width | | 5 | 10 | 5 | 10 | 5 | 10 | 20 | 5 | 10 | 20 | 40 |
| | length | | 125 | 125 | 250 | 250 | 1000 | 1000 | 1000 | 500 | 500 | 250 | 250 |
| TOP CHIP STACK ELEMENT | | ID | 21 | 22 | 23 | 24 | 25 | 26 | 31 | | | | |
| | pad width X | | 80 | 105 | 105 | 105 | 130 | 130 | 140 | | | | |
| | pad width Y | | 80 | 105 | 150 | 200 | 130 | 200 | 200 | | | | |

In accordance with the disclosure, the bottom substrate and the top substrate can contain any materials that can be used in an optoelectronic, a microelectronic, or a micromechanic multi-chip system. For example, but not by way of limitation, the substrate can contain a ceramic material, such as sintered glass, a non-conductive organic material, or a In accordance with the disclosure, a solder material is deposited onto one or more solder pads to make plated solder pads. Solder material can be any solder material used for chip assembly, such as tin, silver, gold, bismuth, indium, lead or a combination thereof In accordance with the disclosure, solder material can be deposited prior to chip assembly on a top chip stack element, on a bottom chip stack element or both. They can also be deposited on the substrate along with or on top of the substrate pad. In some embodiments, the solder material is deposited prior to chip assembly on the bottom substrate. In some embodiments, the solder material is deposited prior to chip assembly on the top substrate. In some embodiments, the solder material is deposited prior to chip assembly on one solder pad to form a plated solder pad and a reservoir pad connected to the solder pad through a flow resistor. In some embodiments, prior to chip assembly, the reservoir pads do not contain any solder material and are empty reservoir pads.

Without being bound by theory, it is believed that the flow resistors allow flow of the melted solder material in a process driven by surface tension. The driver of the flow is reflected by the following equation, wherein Δ p represents the pressure differential between the inside and the outside of the solder, γ represents the surface tension constant of the solder material (typically around 0.5 Newton (N) per meter (m)) and Rx and Ry represent the radii of curvature of the liquid surface of the solder material on the solder pad and the reservoir pad, respectively.

$$\Delta p = \gamma \left( \frac{1}{R_x} + \frac{1}{R_y} \right)$$

During the melting phase of plating, the liquid solder will wet the solder pad, flow resistor and reservoir establishing a continuous extent of liquid solder between a solder pad and the reservoir pad through the flow resistor. Thus, the pressure in the liquid in the solder pads, the flow resistor and reservoir pads is constant and the surface curvature, therefore, will be similar. At the start of melt of over-plated solder pads, it is believed that the solder pads have a smaller radius of curvature and, hence, a larger pressure in which to drive the liquid solder through the flow resistor to the reservoir pad. Conversely, in under-plated solder pads, the solder pads have a larger and potentially negative radius of curvature and, hence, a lower pressure, which forces some liquid solder from the reservoir pad through the flow resistor to the solder pad. Hence, the flow of the solder from over-plated pads to an external reservoir is self-limiting and cannot move into an under-plated situation.

Solder pads, reservoir pads, and flow resistors can have a variety of shapes and sizes. In some embodiments, the solder pads or reservoir pads are circular. In some embodiments, the solder pads or reservoir pads are rectangular, square, elliptical, or triangular. In some embodiments, the reservoir pads and the solder pads are the same shape. In some embodiments, the reservoir pads and the solder pads are different shapes. In some embodiments, for example when electrical connectivity between multiple sites is not detrimental, multiple solder pads can be connected to a single reservoir pad to provide level or balanced solder plating across several sites. In some embodiments, one of several solder pads is connected via a flow resistor to one of several reservoir pads on a substrate.

In some embodiments, the reservoir pad area is commensurate to the solder pad area. A larger reservoir pad can, in some embodiments, provide correction for a wider range of over-plating. When substrate space is restricted, the reservoir pad area can be reduced and/or the reservoir pad location can be adjusted to accommodate spatial restrictions.

In some embodiments, the multi-chip system according to the disclosure is an optoelectronic system. For example, in some embodiments, the top chip stack element and bottom chip stack element can be components of an optoelectronic assembly, such as a semiconductor laser.

Figure 9:
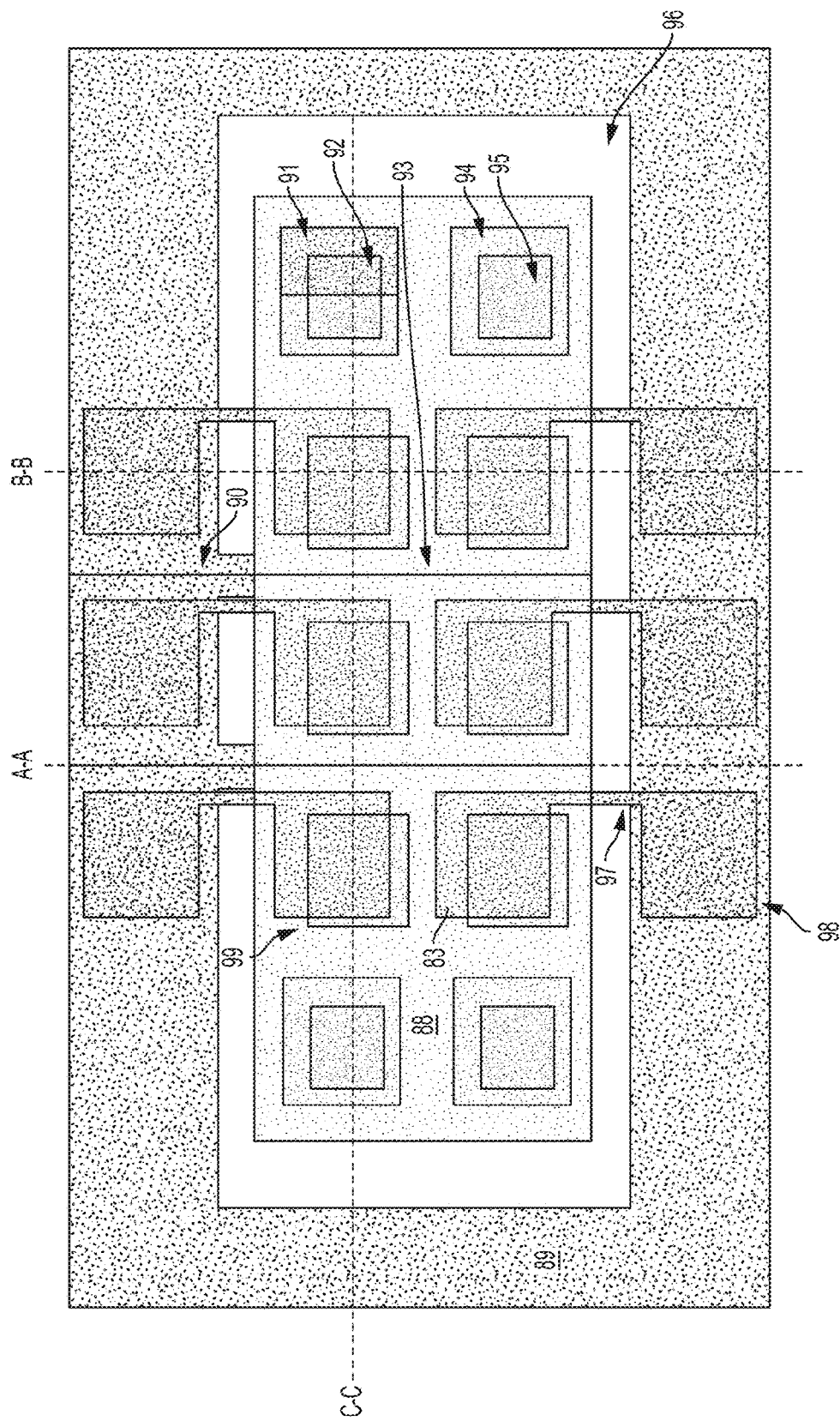
FIG. 9 illustrates a top view of a photonic chip assembly according to an embodiment.

FIG. 9 illustrates a top view of an exemplary photonic chip assembly according to an embodiment including a bottom chip 89 and a top chip 88. In some embodiments, the bottom chip can be a silicon chip and the top chip can be made of silicon, indium phosphide or gallium arsenide. As shown in FIG. 9, bottom chip 89 can include waveguides 90, lateral stops 92, vertical stops 95 a recessed region 96, a flow resistor 97, and empty reservoirs 98. Top chip 88 includes waveguides 93 that can be III-V laser waveguides, solder pads 99, a lateral mechanical stop 91, and a vertical reference area 94 to which the bottom chip standoffs 95 can contact to warrant vertical alignment. In the assembly, solder pads 99 of top chip 88 are in proximity to plated or over-plated solder pads 83. Cross sections of the assembly are depicted in FIG. 9 at A-A, B-B, and C-C. The position and number of the components depicted in FIG. 9 is exemplary only and it is understood that the number and position of components can vary depending, for instance, on application and design constraints.

In some embodiments, methods of the disclosure include coarse-pre alignment that includes a purposeful offset, pick and place, and anneal of a top and bottom chip stack element through solder melting and subsequent cooling. In some embodiments, the anneal time should be sufficient for an over-plated solder pad to become a plated pad through solder material leakage through a flow resistor to a reservoir.

Figure 10A:
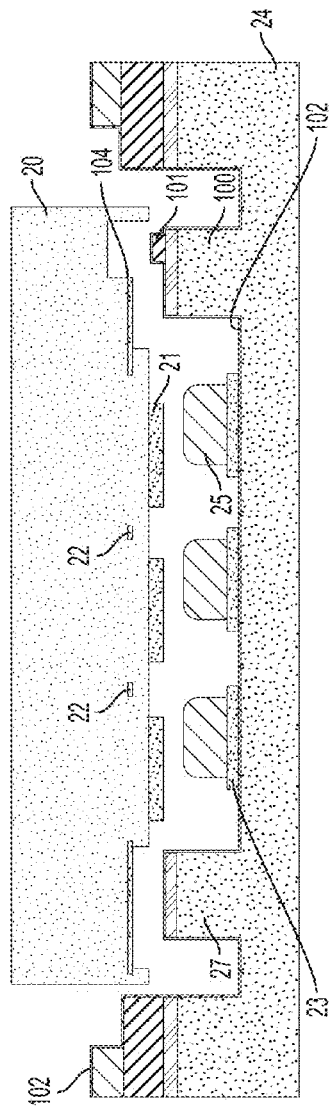
FIGS. 10A-C illustrate cross sectional side views of the photonic chip assembly across the C-C plane of FIG. 9.
Figure 10B:
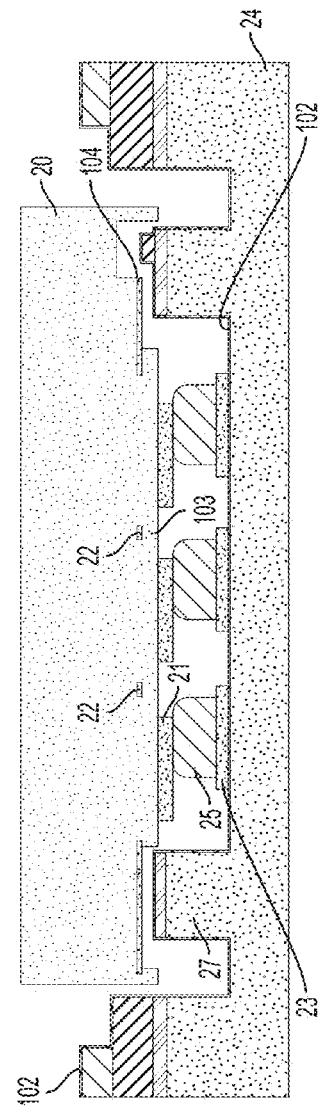
Figure 10C:
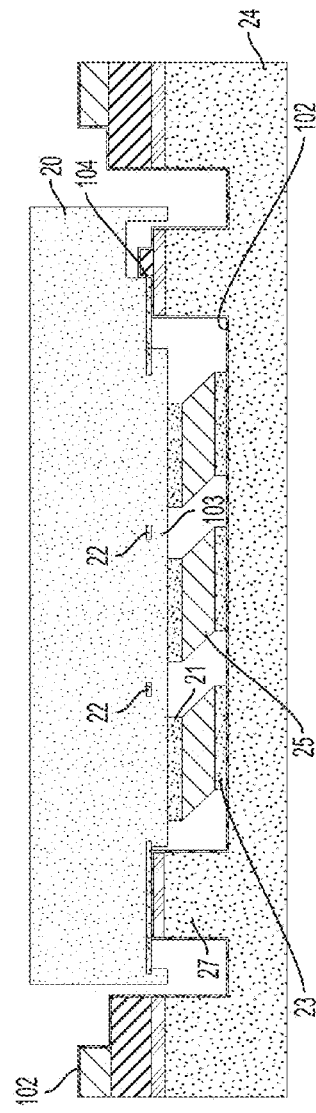

FIGS. 10A-C illustrate cross sectional side views of the photonic chip assembly of FIG. 9 taken across the C-C plane. FIG. 10A is a view of an embodiment illustrated in FIG. 9 taken across the C-C plane after coarse pre-alignment. FIG. 10B is a view of an embodiment taken across the C-C plane after the top chip is placed. The coarse pre-alignment and chip placement can be performed by a pick and place tool as known to the people skilled in the art. This tool can manually or automatically pick a chip, align it, and place it on a substrate or another chip. A vacuum pick tip is often used to hold the top chip during the alignment and placement. FIG. 10C is a view of an embodiment illustrated in FIG. 9 taken across the C-C plane after annealing. As is shown, a bottom chip stack element 24 includes standoffs 27 and 100, mechanical stop 101 corresponding to stop 92 of FIG. 9, an optional encapsulation 102, a solder pad 23 and overplated solder pad 25. Top chip 20, such as an InP chip, includes a waveguide 103 or 22, such as an III-V laser waveguide, and a mechanical stop on a waveguide layer 104 and solder pads 21. The optional encapsulation can be used to prevent the metals of the solder pad or the solder material to potentially react with materials on the silicon chip. For instance, nickel and other metals can form silicides by reacting with exposed silicon at temperatures that are close to the melting temperature of the solder material. In addition the encapsulation can be needed to protect any electronics on the bottom chip from contamination by such as sodium and other mobile species in oxides. An example of an encapsulation could be a silicon nitride, silicon oxide, aluminum oxide, or silicon oxynitride film.

Figure 11A:
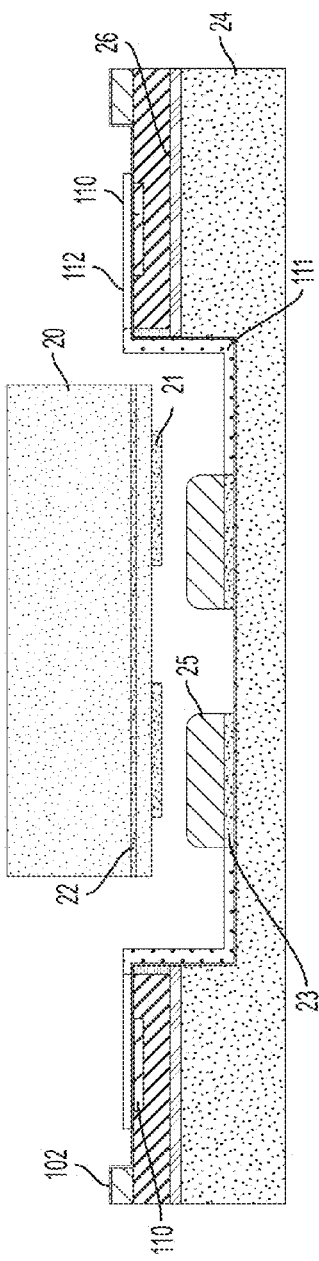
FIGS. 11A-C illustrate cross sectional side views of the photonic chip assembly across the B-B plane of FIG. 9.
Figure 11B:
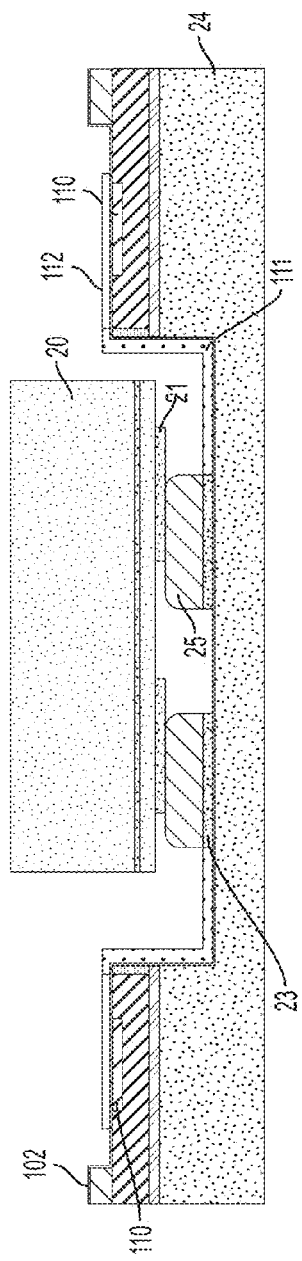
Figure 11C:
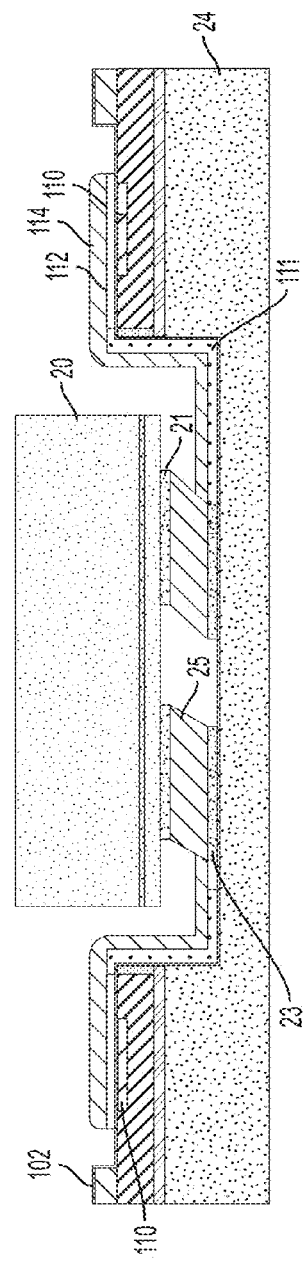

FIGS. 11A-C illustrate cross sectional side views of the photonic chip assembly of FIG. 9 taken across the B-B plane. FIG. 11A is a view of an embodiment illustrated in FIG. 9 taken across the B-B plane after coarse pre-alignment. FIG. 11B is a view of an embodiment taken across the B-B plane after pick and place. FIG. 11C is a view of an embodiment illustrated in FIG. 9 taken across the B-B plane after annealing. As is shown, a bottom chip stack element 24 includes over-plated solder pads 25 and solder pads 23 and a flow resistor 111 leading from the over-plated solder pads 25 to reservoir pad 112. The reservoir pad 112 can be connected to back-end of the line metal contact 110 for electrical connection between optional electrical circuits of the bottom chip 24 to the top chip 20. Top chip 20, such as an InP chip, includes a III-V laser waveguide 22 and solder pads 21. As is shown in FIG. 11C, after anneal, reservoir pad 112 can contain solder 114 that has flowed from over-plated solder pad 25 through flow resistor 111.

Figure 12A:
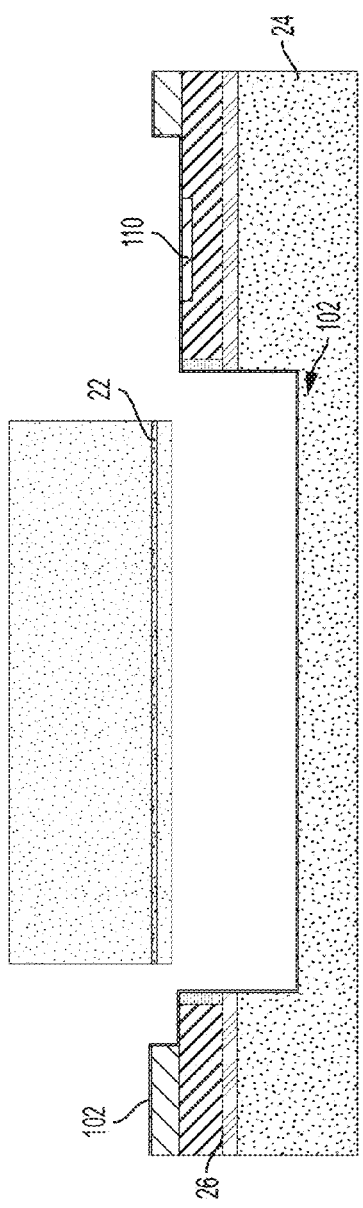
FIGS. 12A-C illustrate cross sectional side views of the photonic chip assembly across the A-A plane of FIG. 9.
Figure 12B:
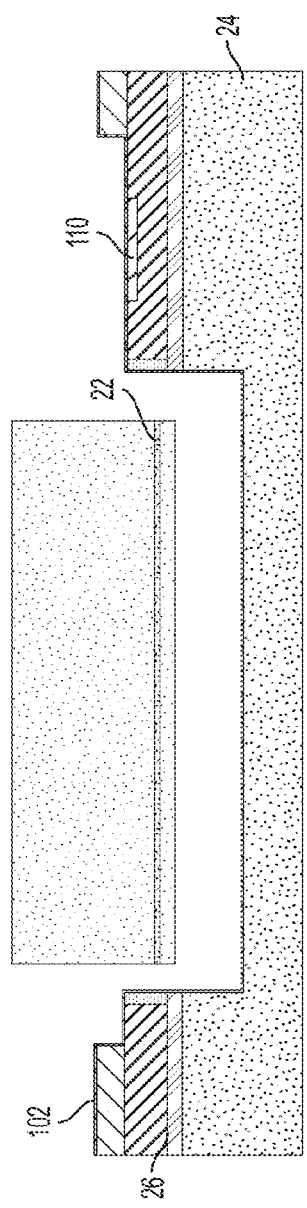
Figure 12C:
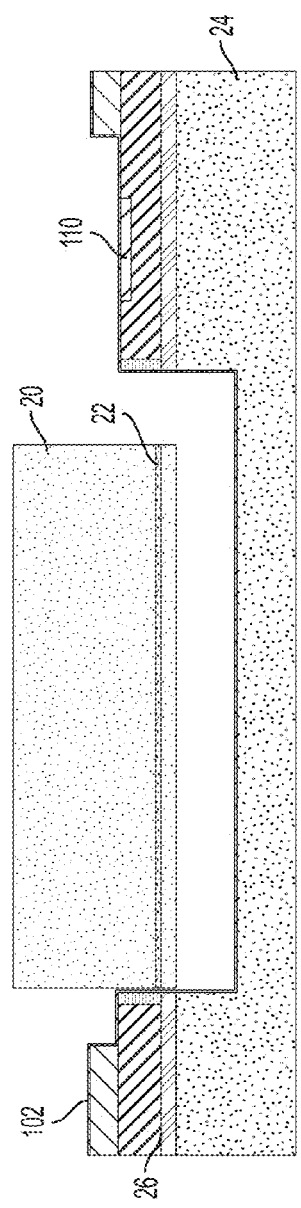

FIGS. 12A-C illustrate cross sectional side views of the photonic chip assembly across the A-A plane of FIG. 9: FIG. 12A is a view during coarse pre-alignment; FIG. 12B is a view after pick and place; FIG. 12C is a view after anneal. After anneal, the waveguide 26 on the bottom chip is well aligned to waveguide 22 on the top chip.

Figure 13A:
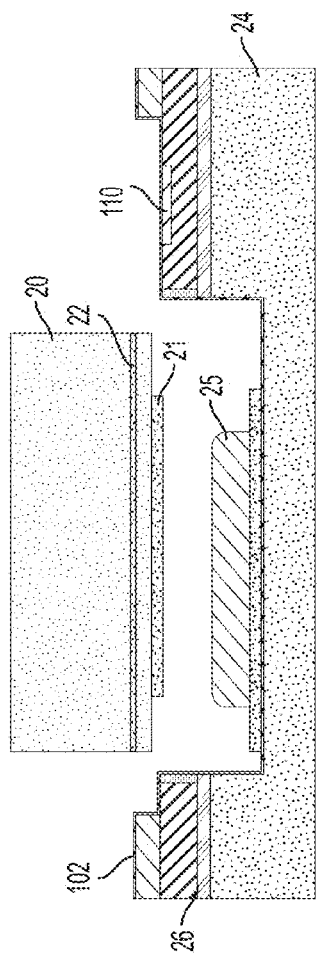
FIG. 13A-C illustrate cross sectional side views of the photonic chip assembly across the A-A plane of FIG. 9 in another embodiment including a heat sink.
Figure 13B:
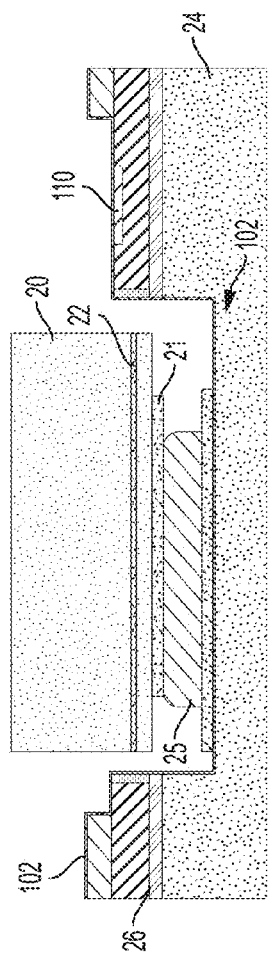
Figure 13C:
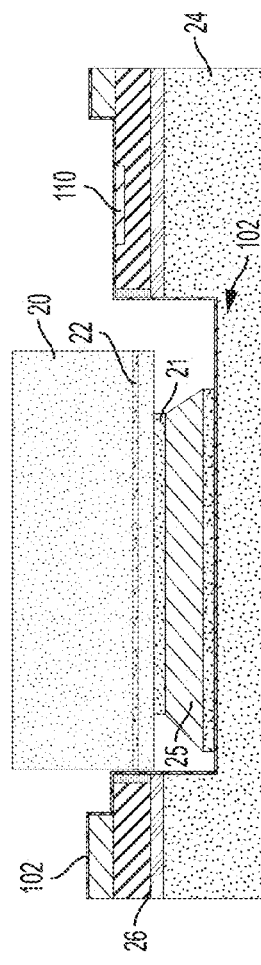

In some embodiments, the multi-chip assembly includes a heat sink in proximity to waveguide 22 of the top chip 20. FIG. 13A-C illustrate cross sectional side views of the photonic chip assembly across the A-A plane of FIG. 9 in another embodiment including a heat sink: FIG. 13A is a view during coarse pre-alignment; FIG. 13B is a view after pick and place; FIG. 13C is a view after anneal. In accordance with FIG. 13, solder 25 can act as a thermal sink, for instance in applications that include heat sensitive components. An example of such application is the case of the waveguide on the top chip being a semiconductor laser waveguide. Semiconductor lasers work best with efficient heat sinking.

In accordance with the disclosure, the top chip stack element of an assembly can be made of any material useful for optoelectronic or microelectronic chip applications. For instance, top chip stack element can be composed of InP, GaAs (gallium arsenide), or silicon.

In some embodiments, a polymeric underfill can be included in one or more chip stack elements to fill gaps between waveguide structures and provide better thermo-mechanical reliability. The underfill could be a thermally cured epoxy or silicone. Filling gaps between the bottom chip and top chip waveguides can improve optical coupling performance in many cases by improving transmission and reducing reflection.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of assembling a multi-chip system, comprising:
   providing a first chip stack element having two major surfaces, the first chip stack element comprising a first solder pad on a plane of one of the major surfaces, a first vertical stop, a first lateral stop, and a first waveguiding element;
   providing a second chip stack element having two major surfaces, the second chip stack element comprising a second solder pad, a flow resistor connected to the second solder pad, a second vertical stop, a second lateral stop, a reservoir pad connected to the flow resistor, and a second waveguiding element;
   optionally plating the reservoir pad with a reservoir solder material;
   plating a solder material on the second solder pad to form a plated solder pad, wherein the height of the plated solder material on the second solder pad is at a height that is higher than the height of plated reservoir solder material;
   pre-aligning the first chip stack element and the second chip stack element to bring the first solder pad in proximity to the plated solder pad;
   raising the temperature to a temperature above the melting temperature of the solder material;
   flowing solder through the flow resistor;
   aligning the first and second waveguiding elements;
   cooling the connected assembly to re-solidify the solder material.

2. The method of claim 1, comprising plating the first solder pad with a first pad solder material, wherein a summed height of the first pad solder material solder and the plated solder material on the second solder pad is such that it prevents physical contact between the vertical stop and the second vertical stop and the summed height is such that the lateral stop and the second lateral stop do not overlap to bring the first solder pad in proximity to the second solder pad when the first and second chip stack elements are pre-aligned.

3. The method of claim 1, wherein the first and second waveguiding elements are first aligned in the horizontal direction, and then aligned in the vertical direction.

4. The method of claim 1, the method further comprising plating reservoir solder material on the reservoir pads prior to pre-aligning.

5. The method of claim 1, comprising plating a first solder pad with solder material prior to pre-aligning.

6. The method of claim 1, wherein the second chip element is an indium phosphide or gallium arsenide chip.

7. The method of claim 1, wherein the solder is AgSn or AuSn.

8. The method of claim 1, wherein the solder pad and plated solder pad are offset after cooling the connected assembly.

9. The method of claim 1, wherein the second chip stack element comprises a thermal sink.

10. The method of claim 1, wherein the waveguide in first chip stack element is a III-V laser waveguide or III-V semiconductor optical amplifier waveguide.

11. A multi-chip system, comprising
a first chip stack element having two major surfaces, the first chip stack element comprising a first solder pad on a plane of one of the major surfaces, a first vertical stop, a first lateral stop, and a first waveguiding element;
a second chip stack element having two major surfaces, the second chip stack element comprising a second solder pad, a flow resistor connected to the solder pad, a reservoir pad connected to the flow resistor, a second waveguiding element, a second vertical stop, and a second lateral stop; and
a solder material connecting the first solder pad to the second solder pad;
wherein the first lateral stop is in proximity to the second lateral stop;
wherein the first vertical is in proximity to the second vertical stop;
wherein the first waveguiding element is in proximity to the second waveguiding element; and
wherein the solder pad and plated solder pad are offset in the horizontal direction.

12. The multi-chip system of claim 11, wherein the flow resistor and the reservoir pad are covered with solder material.

13. The multi-chip system of claim 12, wherein the height of the solder material on the flow resistor and reservoir pad is smaller than the height of the solder material connecting the first solder pad of the first chip stack element to the second solder pad of the second chip stack element.

14. The multi-chip system of claim 11, wherein the first vertical stop is in contact with the second vertical stop.

15. The multi-chip system of claim 11, wherein the first lateral stop is in contact with the second lateral stop.

16. The multi-chip system of claim 11, further comprising a polymeric underfill adjacent to the first or second waveguiding element.

17. The multi-chip system of claim 11, wherein the second chip element is an indium phosphide or gallium arsenide chip.

18. The multi-chip system of claim 11, wherein the solder material is AgSn or AuSn.

19. A chip stack element, comprising
a first major surface,
a second major surface,
a waveguiding element,
a solder pad,
solder plated on the solder pad to form a plated solder pad,
a flow resistor connected to the plated solder pad, and
a reservoir pad connected to the flow resistor; and
a reservoir solder plated on the reservoir pad, wherein the solder plated on the solder pad is plated at a height that is lower than the height of the reservoir solder.

* * * * *